United States Patent
Iijima

[11] Patent Number: 6,163,200
[45] Date of Patent: Dec. 19, 2000

[54] GATE DRIVER DEVICE FOR GTO THYRISTOR

[75] Inventor: Katsuhiko Iijima, Tokyo, Japan

[73] Assignee: Elmec Inc., Tokyo, Japan

[21] Appl. No.: 09/328,395

[22] Filed: Jun. 9, 1999

[30] Foreign Application Priority Data

Jun. 11, 1998 [JP] Japan ................................... 10-163432

[51] Int. Cl.[7] .................................................. H03K 17/72
[52] U.S. Cl. ........................... 327/438; 327/440; 327/443; 257/147
[58] Field of Search .................................... 327/438, 440, 327/441, 442, 443, 445, 185, 190, 582; 257/115, 147

[56] References Cited

U.S. PATENT DOCUMENTS

| | | | |
|---|---|---|---|
| 4,767,948 | 8/1988 | Marquardt | 327/530 |
| 5,237,225 | 8/1993 | Grüning | 327/440 |
| 5,262,691 | 11/1993 | Bailey et al. | 327/440 |
| 5,457,416 | 10/1995 | Song et al. | 327/438 |
| 5,483,192 | 1/1996 | Tai | 327/440 |
| 5,493,247 | 2/1996 | Gruning | 327/440 |

*Primary Examiner*—Timothy P. Callahan
*Assistant Examiner*—An T. Luu
*Attorney, Agent, or Firm*—Armstrong, Westerman, Hattori, McLeland & Naughton

[57] ABSTRACT

In a gate driver device, cathode conductor 2, gate conductor 3, and positive and negative conductors 8 and 9 between the principal turn-on and turn-off capacitors and MOSFET switching elements Q11–Q1i and Q21–Q2j are disposed on a wide plate. A thin insulation layer is inserted between conductor 3 and conductors 8 and 9. Numerous chip-type ceramic capacitors C11–C1m and C21–C2n to be used as principal capacitors are arranged in rows in the space between conductor 2 and conductors 8 and 9. The gate voltage of switching elements Q11–Q1i is reduced exponentially by time constant circuit TC, and the leak inductance of transformer Thf is employed to smooth the charging current.

4 Claims, 10 Drawing Sheets

Circuit Makeup

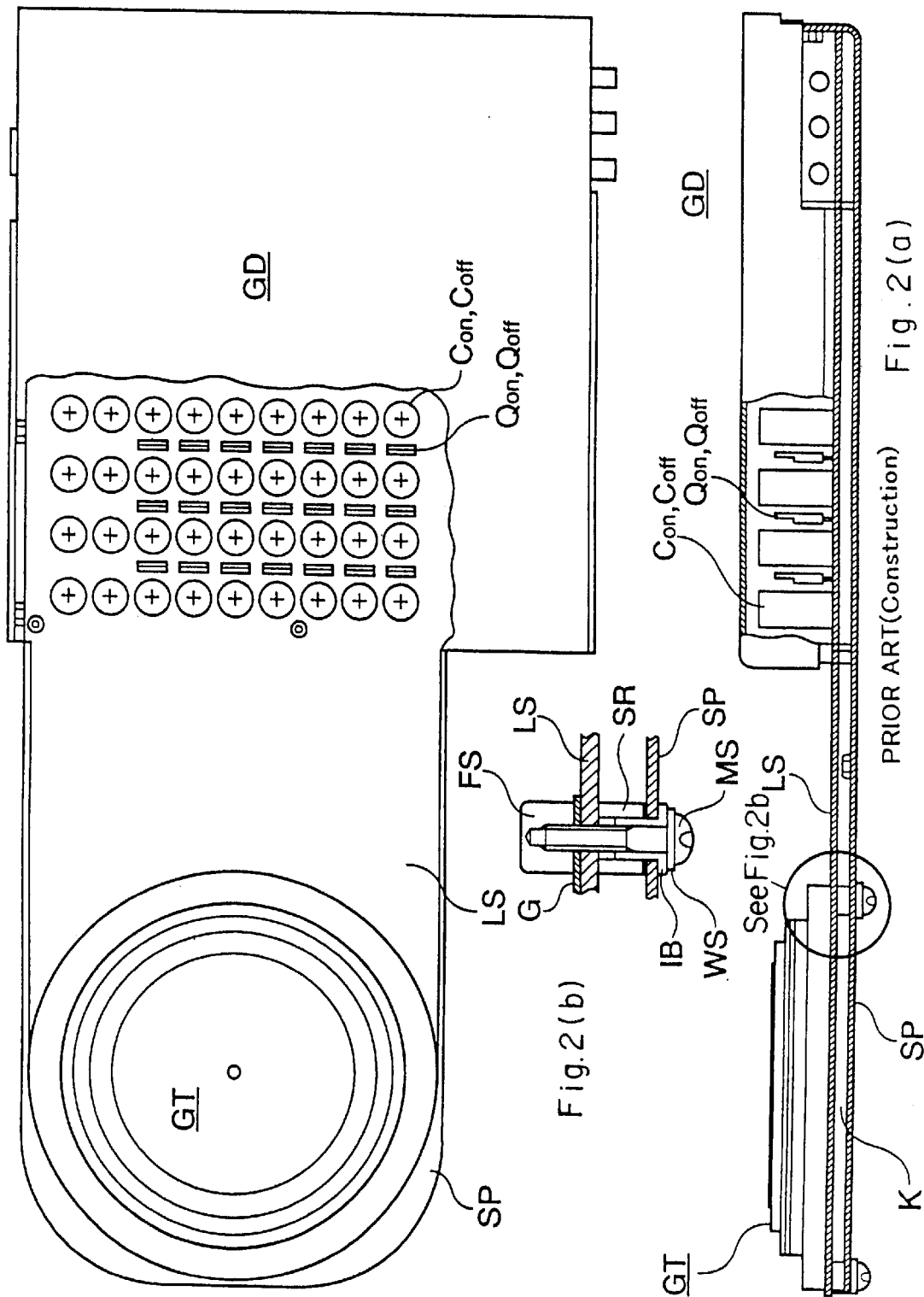

Mounted Construction (Top-view)

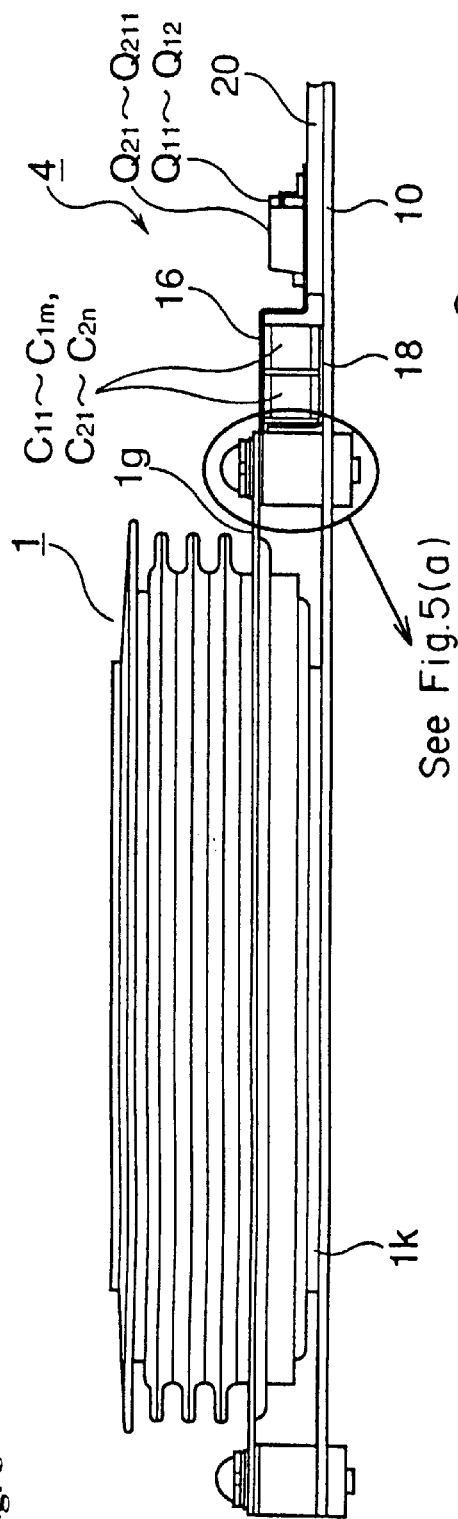
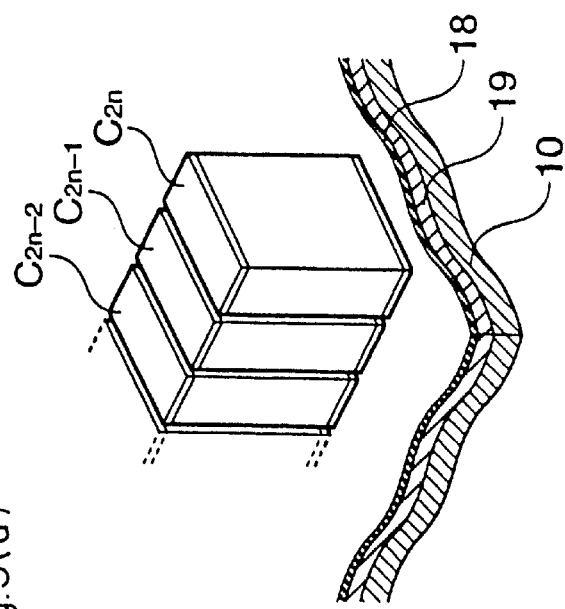
Fig. 5(b) Layout of Capacitors
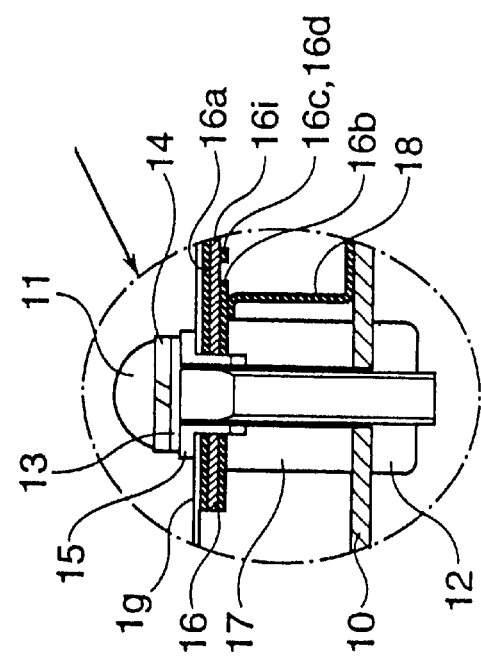
Fig. 5(a) Mounted Construction (Side-view)

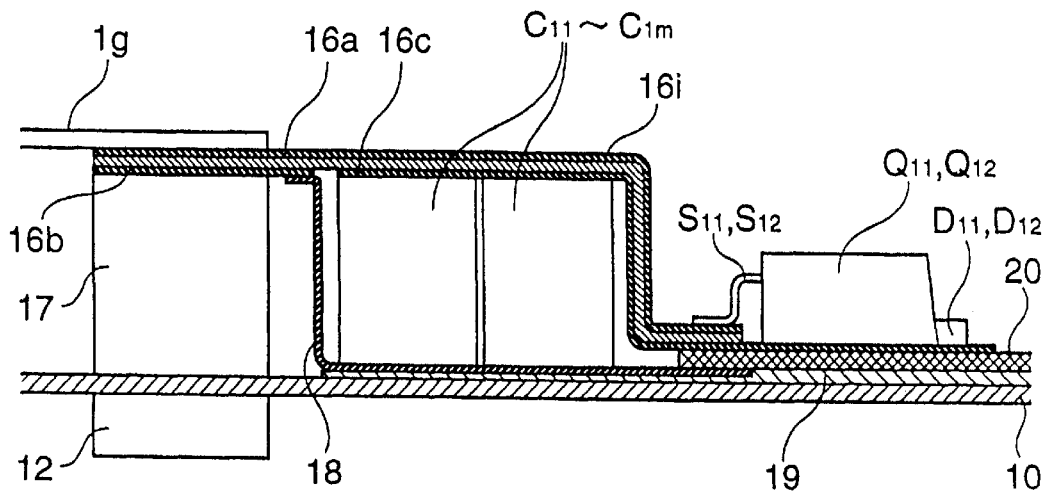
Fig. 6(a)   Principal Turn-on Part
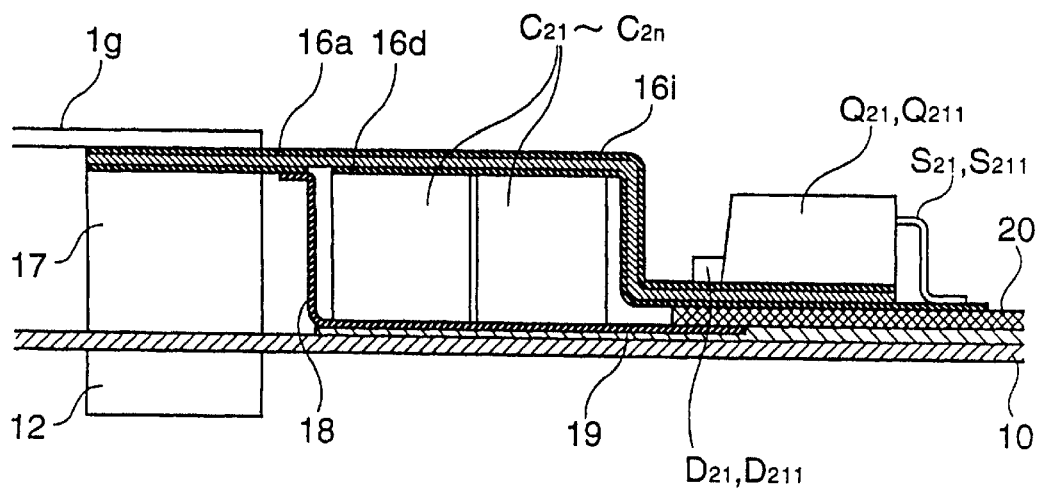
Fig. 6(b)   Principal Turn-off Part

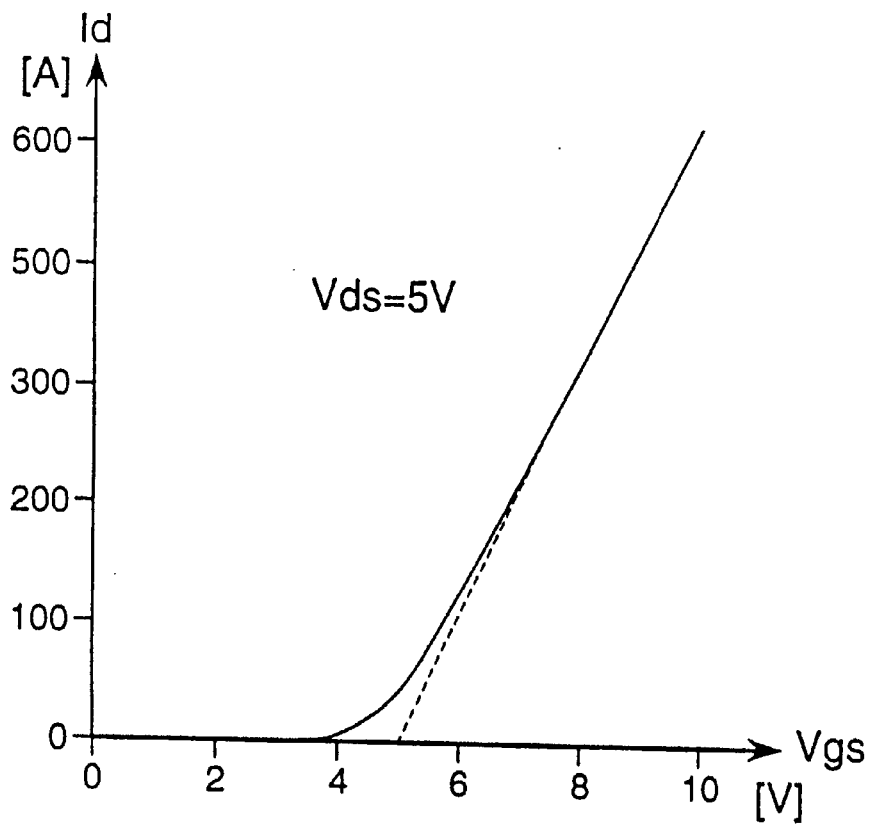
Fig. 7(a)  Id-Vgs Characteristics
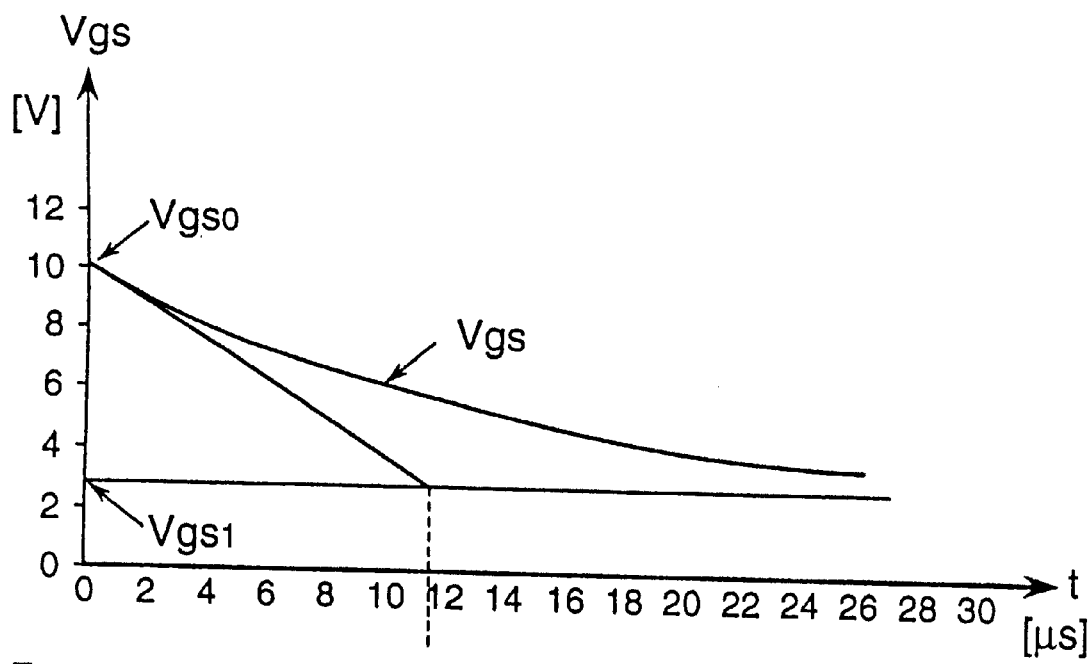
Fig. 7(b)  Temporal Changes of Vgs

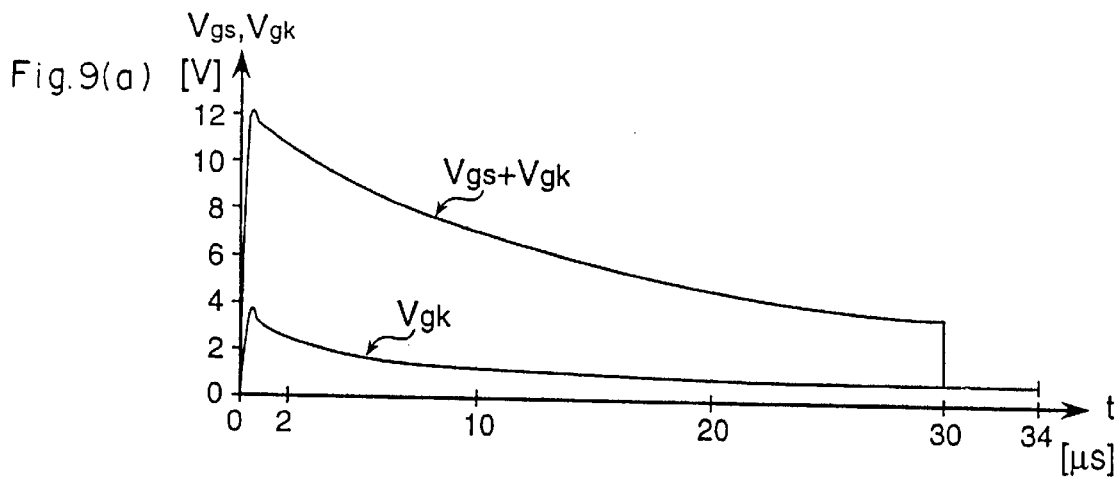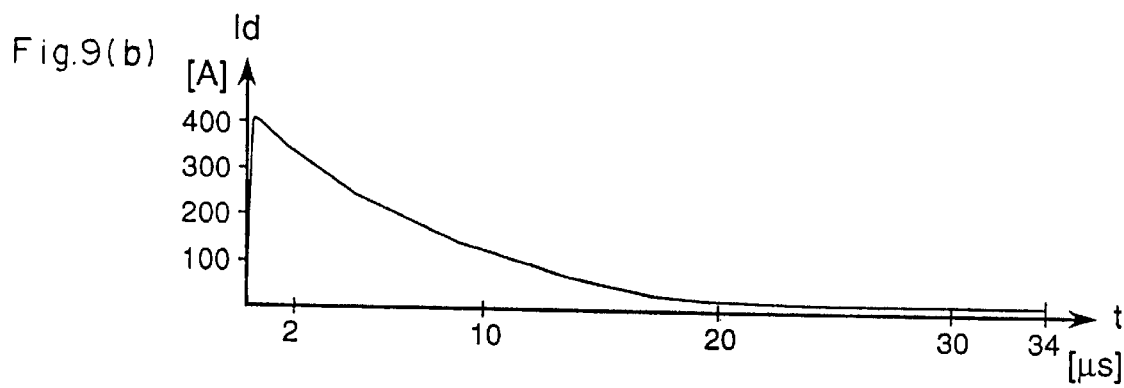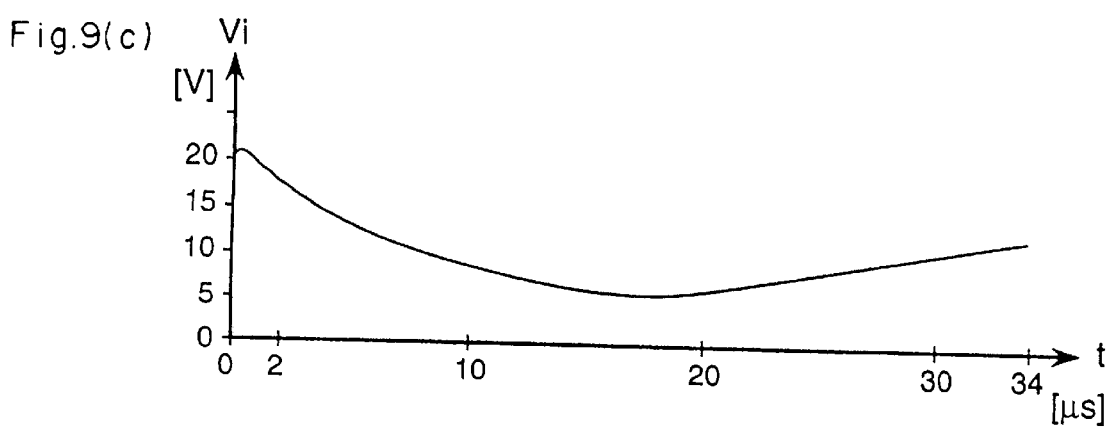
Examples of Actual Measurements of Voltages and Currents of Various Parts during GTO Turn-on Operation

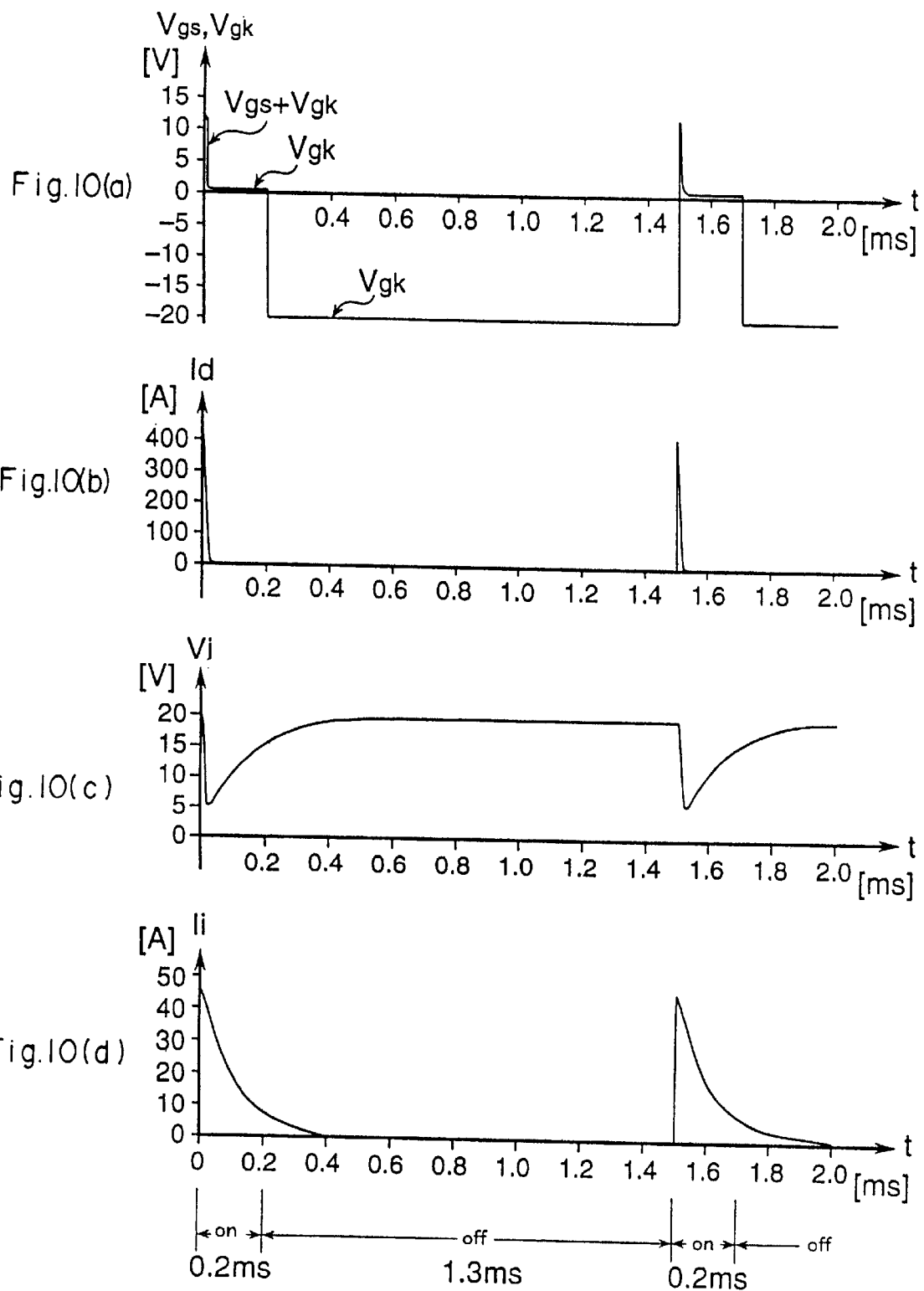
Examples of Actual Measurements of Voltages and Currents of Various Parts during GTO Turn-off Operation

GATE DRIVER DEVICE FOR GTO THYRISTOR

BACKGROUND OF THE INVENTION

1. Field of the Invention

The present invention relates to a latching type power semiconductor having an anode, a cathode, and a gate, which is capable of self-arc-extinguishing, in other words, relates to a gate driver device for a GTO thyristor (Gate Turn-Off thyristor). More specifically, the present invention relates to a gate driver device for a GTO thyristor with a newly improved version of the commutation function of a so-called GCT thyristor (Gate Commutated Turn-off thyristor).

The gate driver device according to the present invention is particularly suitable for controlling GCT thyristors used for large-capacity inverters, but it is also suitable for controlling GCT thyristors used in the high-voltage or large-current parallel connected form in various power conversion devices such as SVCs (Static Var Compensators), VSCs (Voltage Source Converters), etc., of pulse-controlling-type power source equipment and electrical power systems.

2. Description of the Prior Art

When turning off a GTO thyristor, conventional GTO thyristor gate drivers generally cut the current off when the ratio $I_A/I_{GQ}$, the ratio of the principal anode current $I_A$ to the turn-off gate current $I_{GQ}$, expressed as turn-off gain $G_O$, is between "3" and "5". In such cases, with conventional GTO thyristors, there are significant variations in turn-off peak voltages due to variations in elements because of the long storage time ts at turn-off. This makes it difficult to operate many series/parallel-connected thyristors simultaneously. Thus, in developing a new type of GTO thyristor, elements free of such variations had to be carefully selected. Also, in conventional GTO thyristors, in order to ensure a reliable turn-off operation, a snubber circuit (normally consisting of a resistor R, a capacitor C, and a diode D) equipped with a snubber capacitor C is required to control the dv/dt at the time of turn-off. And the snubber loss at the time of discharge of such snubber capacitors is too large to be ignored.

To address such problems of the conventional-type GTO thyristors, a method was conceived of turning off the thyristor power semiconductor element with the turn-off gain $G_O (=I_A/I_{GQ})$ at 1 by making the gate current rise rate dig/dt (ig: momentary gate current) extremely large and commutating all the main current $I_A$ to the gate circuit. Methods of this type are described in the specifications of U.S. Pat. Nos. 5,237,225, 5,345,096, and 5,493,247. In order to realize a turn-off at such a gain $G_O=1$, a large-capacity power semiconductor element with various improvements, such as a lowering of the element gate inductance through certain changes to the construction of the area around the gate electrodes of conventional GTO thyristors, appeared on the scene under the name "GCT Thyristor" (e.g., see pages 372–373 of the May 1997 edition of Transistor Technology).

FIGS. 1 and 2 show the circuitry and construction, respectively, of the gate drivers for a GTO thyristor in the prior art. FIG. 1(a) shows a conventional turn-off gate circuit with the inductance of the various circuit parts of the conventional-type GTO thyristor TH expressed equivalently. FIG. 1(b) shows a conventional turn-off gate circuit with the inductance of the various circuit parts of the above-mentioned improved-type GTO thyristor, that is, the GCT thyristor GT. FIG. 1(c) schematizes the conventional gate drive circuit (driver) GD of the GCT thyristor GT. FIG. 2 shows the top- and side-views of the mounted construction of a conventional gate driver device of the GCT thyristor GT. In the drawing, G and K respectively denote the gate and cathode electrodes of the thyristor GT; SP is the gate driver supporting plate (with the same potential as the cathode electrode K); LS is a multi-layer substrate provided on its upper face with a conductor connected to the gate electrode G and, on its lower face, with a conductor connected to the cathode electrode K; MS and FS are a screw and a screw attaching ring; IB is an insulation bushing; WS is a washer; and SR is a metal space ring.

As shown in FIG. 2, in order to realize commutation at turn-off gain $G_O=1$, the GCT thyristor GT improves the gate connection construction by providing a ring-shaped gate electrode G around the outer part of the thyristor package GT. This arrangement is sometimes referred to as a "Coaxial GTO". As a result of employing such a gate electrode G, the inductance inside the power element can be generally reduced to about one tenth [FIG. 1(b) "2 nH (nano-henry)"] of the conventional-type GTO thyristor TH [FIG. 1(a) "30 nH"]. In addition, by improving the gate lead through means such as the use of a laminated printed circuit board to connect the gate drive GD and the power element GT, the total inductance of the gate circuit can be reduced substantially-for example, to about one hundredth of the total inductance of a conventional GTO thyristor TH using a coaxial cable [FIG. 1(a)]—resulting in an extremely large gate current rise rate dig/dt [refer to FIG. 1(b)].

This type of GCT thyristor greatly lowers the storage time ts—for example, to about one tenth the ts of a conventional GTO thyristor. In addition, when using GCT thyristors, there is no need for a snubber circuit for the control of dv/dt, as required when using conventional GTO thyristors, and thus a snubberless turn-off is possible. Cut-off can therefore be achieved using only a clamping circuit, in the same manner as for a large-capacity IGBT (Integrated Gate Bipolar Transistor). By eliminating snubber loss in this manner, a large reduction in total loss can then be realized. Finally, the GCT thyristor makes it possible to lower the gate storage electric charge to about one half that of a conventional GTO thyristor, thereby allowing for a reduction in gate-driver power consumption.

With respect to the mounted construction of the conventional gate driver (FIG. 2), this includes, on top of a laminated printed circuit board LS connected to the gate and cathode electrodes G and K of the GTO or GCT power semiconductor element GT, such circuit features as switching elements Qon and Qoff for turning on and off the supply of the turn-on current and the turn-off current to the gate, and capacitors Con and Coff for storing electric charges for supplying the turn-on and turn-off currents. For example, many MOSFET (Metal Oxide Semiconductor Field Effect Transistors) are used in the switching elements Qon and Qoff, and many chemical capacitors, such as electrolytic aluminum capacitors, are used as the capacitors Con and Coff. In this case, a lowering of the inductance of the gate circuit is sought and a large gate current rise rate dig/dt is obtained by, among other methods, lining-up these many elements in series.

However, the chemical capacitors Con and Coff used here for the supply of the turn-on and turn-off currents are characterized by the problems of large inductance and large equivalent direct current resistance (ESR), with the result that the capacity of capacitors must be increased to more than necessary. In other words, in order to achieve the desired turn-on/off functions, many large-capacity capacitors must be lined up in parallel until the required equivalent series resistance and inductance are obtained. However, when chemical capacitors with large equivalent series resistance and inductance are used, the capacity of the capacitors will exceed the electric load required for turn-on/off. This results in the drawback of an increase in the size of both the gate driver GD and the wiring inductance, and thus the gate-circuit inductance cannot be lowered appreciably.

In addition, the inductance of the laminated printed circuit board increases in proportion to the thickness of the intermediate insulation layer, whereas, in conventional GTO and GCT thyristors, etc., a thick laminated printed circuit board LS (FIG. 2) is used to connect the power elements GT to the gate circuit and to mount MOSFET, chemical capacitors, and other circuit elements. This is an extremely inconvenient arrangement in terms of reducing the inductance. Also, with respect to the cut-off performance of these GTO and GCT power semiconductor elements, since the gate current rise rate dig/dt, when snubberless, increases in proportion to the "total inductance Lg of gate voltage Vg/gate circuit," the following drawback arises: although lowering the inductance is a precondition for obtaining the desired performance, the gate current rise rate dig/dt cannot be increased very appreciably because the inductance cannot be lowered under these circumstances, and thus, under the condition of a snubberless, the turn-off current cannot be increased.

Also, when turning on GCT and other improved-type GTO thyristors, increasing the gate current rise rate dig/dt not only has the effect of reducing the switching loss, but is also a necessary technique for obtaining the sudden start-up currents of pulse power source devices, etc. From this point of view, since the conventional turn-on gate circuit has resistors for limiting current and preventing resonance inserted in a series between the switching elements and capacitors connected in the series to the gate and cathode of the power semiconductor element, a large gate current rise rate dig/dt cannot be expected. Therefore, this conventional circuit has drawbacks such as the impossibility of hard-on or the occurrence of large turn-on loss.

In the conventional turn-on circuit of the power semiconductor element of GTO and GCT thyristors, etc., in order to have a large current flow into gate electrode G at the instant the power semiconductor element GT is turned on, as shown by turn-on current G Don in FIG. 1(c), after rectifying the output of the transformer Tr with diodes Da and Db, a turn-on electric load is charged in advance in a main capacitor Con of suitable capacity via smoothing inductance Lf and current-limiting series resistance Rs. Then, by inputting turn-on signal ON, the switching power MOSFET element Qon is made to come on for an appropriate period, and the electric load that was charged in the main capacitor C is diverted into the gate electrode G of the power element GT via the series resistance Rs.

In this case, not only do the sizes of the inductance Lf and resistance Rs greatly limit their mounting in the gate driver device, but at the same time, because the series inductance actually exists in resistance Rs, it is not possible to quickly start up the turn-on gate current or reduce the switching loss when turning on the power semiconductor element GT. This results in a loss in the resistance Rs itself, among other drawbacks.

Also, due to the existence of the smoothing inductance Lf in the power source circuit, a series circuit Lf–Rs–Con is created so that, in the case of Rs<2 $(Lf/Con)^{1/2}$, resonance occurs between the inductance Lf and gate current supply capacitor Con. This results in the terminal voltage of the capacitor Con overshooting the output voltage of the transformer Tr after element Qon goes off, thus extending the charging time of the capacitor Con and leading to such demerits as an inability to raise the switching frequency, etc.

SUMMARY OF THE INVENTION

The present invention is designed to overcome the above problems. Its purpose was thus to supply a gate drive for GTO thyristors, including GCT-type thyristors (hereinafter referred to as simply "GTO thyristor(s)"), that would lower the inductance between gate and cathode, miniaturize the gate driver circuit and, at the same time, improve reliability.

A further purpose of this invention is to further miniaturize the gate driver device by improving the gate control of the turn-on circuit switching elements, thereby eliminating the need for resistance between the switching elements and capacitors, and, moreover, to provide a GTO thyristor gate driver device capable of greatly increasing the gate current rise rate dig/dt when turned on.

Another object of the present invention is to supply a GTO thyristor gate driver device capable of rapid charging without any overshooting or power loss of the charging capacitor for supplying turn-on/off currents, while simplifying the makeup of the charging circuit, miniaturizing the equipment, and allowing for rapid device operation.

The present invention realizes the above objects by a gate driver device for a GTO thyristor for turning on and off said GTO thyristor using an electric charge stored in a capacitor, said gate driver device comprising a first and second plate-shaped conductors which are connected to a cathode and a gate of said GTO thyristor respectively, a plurality of chip-type capacitors, the electrodes on one side of which are connected to said first plate-shaped conductor, a third plate-shaped conductor connected to the electrodes on the other side of said chip-type capacitors, and a plurality of switching elements, a first and second principal electrodes of which are connected between said second and said third conductors, wherein said second and third plate-shaped conductors are formed to face each other and separated by a thin insulation layer, and said plurality of chip-type capacitors equipped with electrodes arranged to face each other on both end portions of said capacitors are mounted in the space between said first plate-shaped conductor and said third plate-shaped conductor. Moreover, the plurality of chip-type capacitors are ceramic capacitors and arranged so that non-electrode sides in the direction of the thickness of said chips are adjacent to each other, and both electrode sides of said chips are connected to a surface of said first plate-shaped conductor and a surface of said third plate-shaped conductor respectively.

Generally, when a GTO thyristor is made snubberless by making the turn-off gain $G_O=I_A/I_{GQ}=1$, where $G_O$ is the ratio of the principal anode current $I_A$ to the turn-off gate current $I_{GQ}$, the cut-off capability of the principal current is determined by the size of the gate current rise rate dig/dt. Similarly in the case of turn-on, the turn-on loss is determined by the size of the gate current rise rate dig/dt. On the other hand, when total inductance Lgk is the total of (1) the internal inductance of the GTO thyristor package existing between the GTO thyristor gate and cathode themselves, (2) the inductance between the gate and gate drive circuit, and (3) the inductance of the gate drive circuit, the gate current rise rate dig/dt is determined by the ratio Vgk/Lgk of the total inductance Lgk existing both in the circuit connecting the gate and cathode of the GTO thyristor, and in the gate—cathode circuit of the GTO thyristor itself.

Accordingly, in order to make the gate current rise rate dig/dt large, either the gate voltage Vgk must be made large or the total inductance Lgk must be made small. However, if the gate voltage Vgk is made large, then the makeup of the gate drive circuit will become complex and the power consumption will increase. For this reason, the present invention replaces the conventionally used electrolytic aluminum capacitors with many chip-type capacitors equipped with electrodes at both chip ends, such as chip-type ceramic capacitors, for use as the capacitors to be connected in series to the switching elements between the gate and cathode of a GTO thyristor. In addition, two flexible and wide plate-shaped conductors (second and third conductors), separated by a thin insulation layer, are provided, and the chip-type capacitors are sandwiched and installed in rows between these two conductors so that their non-electrode sides in the thickness direction of the chips are adjacent.

Thus, with the present device, the ceramic and other chip-type capacitors have small equivalent direct current resistance values and inductance. Also, the two conductors to be connected to either of the capacitor terminals face each other across a very narrow distance via a thin insulation layer, so that their inductance is extremely small. Thus the inductance of the circuit between the GTO thyristor gate and cathode is greatly lowered. Therefore, the total inductance Lgk can be greatly reduced and an extremely large gate current rise rate dig/dt can be obtained.

Conductor plates made of copper and other metals can also be used, but when the gate driver device is activated, because the ceramic and other chip-type capacitors connected to these conductors have very small expansion coefficients and are relatively fragile compared to those used with other metal conductors, large turn-on/off currents will flow through these conductors and create a rise in temperature. In such cases, there is a concern that the device will be liable to break. However, because of the layout of this device's capacitors and conductors, the thermal expansion of the conductors will be absorbed by the non-electrode sides of the adjacent capacitors, thereby preventing any breakage of the capacitors due to a difference in thermal expansion between the capacitors and conductors.

According to another feature of the present invention, the gate driver device for a GTO thyristor for turning on and off said GTO thyristor using an electric charge stored in a capacitor comprises turn-on capacitors, the electrodes formed on one side of which are connected to a first conductor, which is connected to a cathode of said GTO thyristor, switching elements with gate electrodes, both principal electrodes of which are connected between a second conductor connected to a gate of said GTO thyristor and a third conductor connected to the electrodes on the other side of said turn-on capacitors, a holding current supplying means for supplying a constant gate holding current to said gate of said GTO thyristor through said second conductor during the period where the GTO thyristor is turned on, and a gate signal control circuit for said switching elements equipped with time constant elements, wherein said gate signal control circuit for switching elements supplies said gate electrodes of said switching elements with a gate voltage which decreases exponentially until the gate current of said GTO thyristor reaches the gate holding current.

In other words, this device is unique in that, by controlling the gate signal voltage of the switching power MOSFET of the turn-on circuit so that the voltage decreases exponentially, resistance need not be inserted in the turn-on circuit, and the gate current rise rate dig/dt can be greatly increased by providing the GTO thyristor gate with a turn-on current which initially, upon turn-on, has a high peak value and is reduced by desired temporal changes.

According to another feature of the present invention, a gate driver device for a GTO thyristor for turning on and off said GTO thyristor using an electric charge stored in a capacitor comprises turn-on capacitors, the electrodes formed on one side of which are connected to a first conductor, which is connected to a cathode of said GTO thyristor, switching elements with gate electrodes, both principal electrodes of which are connected between a second conductor connected to a gate of said GTO thyristor and a third conductor connected to the electrodes on the other side of said turn-on capacitors, and a rectifying circuit for charging capacitors of an insulated power source equipped with a switching transformer for power source insulation, wherein said switching transformer is driven by a high-frequency rectangular wave voltage, and a resultant rectified output is supplied directly to said turn-on capacitors through said first conductor and said third conductor.

That is, the invention is also unique in that, after rectifying the transformer output by utilizing the leakage inductance and rapid switching action of the switching transformer of the capacitor charging rectifier circuit, and supplying the resultant current directly to the turn-on capacitors without inserting any inductance and resistance, rapid charging is possible with no overshooting or power loss. Moreover, the makeup of the turn-on gate circuit can be extremely simplified.

BRIEF DESCRIPTION OF DRAWINGS

FIG. 2 shows the mounted construction of a gate driver device in the prior art;

FIG. 5(a) is a side view of the above mounted construction, and FIG. 5(b) is a perspective view of the connected layout of the capacitors of the above mounted construction;

FIG. 6(a) is an enlarged cross-sectional side view of the turn-on unit of the above mounted construction, and FIG. 6(b) is an enlarged cross-sectional side view of the turn-off unit;

FIG. 7(a) is an example of the voltage characteristic between gate and source to the drain current of the turn-on switching elements, and FIG. 7(b) shows a design example of temporal voltage changes between gate and source due to the time constant circuit;

FIG. 9(a) shows examples of voltages between the gate and source of a turn-on switching element and between the gate and cathode of a GTO thyristor, FIG. 9(b) shows an example of the drain current of the turn-on switching elements, and FIG. 9(c) shows an example of the turn-on circuit input voltage Vi; and FIG. 10(a) shows examples of actually measured waveforms of voltages between the gate and source of a turn-on switching elements and between the gate and cathode of a GTO thyristor, FIG. 10(b) shows an example of the actually measured waveform of the drain current Id of a turn-on switching elements, FIG. 10(c) shows an example of the actually measured waveform of the turn-on circuit input voltage Vi, and FIG. 10(d) shows examples of actually measured waveforms of the turn-on circuit input current Ii.

PREFERRED EMBODIMENT OF THE INVENTION

Figure 1A:
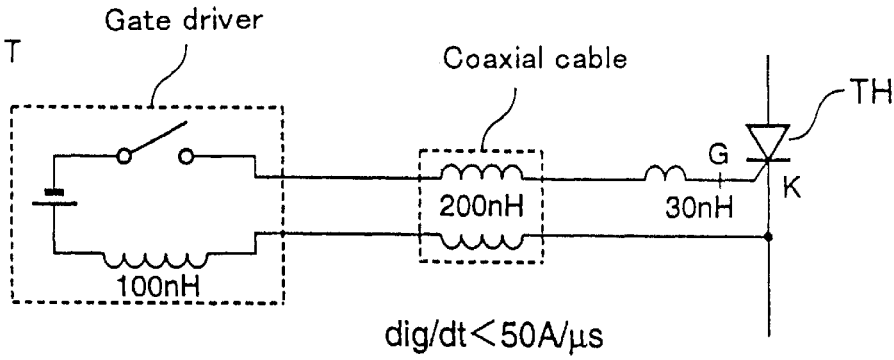
FIG. 1(a) and FIG. 1(b) show turn-off gate circuits for a conventional-type GTO thyristor TH and an improved-type GTO thyristor (GCT thyristor) GT in the prior art, in which various circuit parts are expressed equivalently.
Figure 1B:
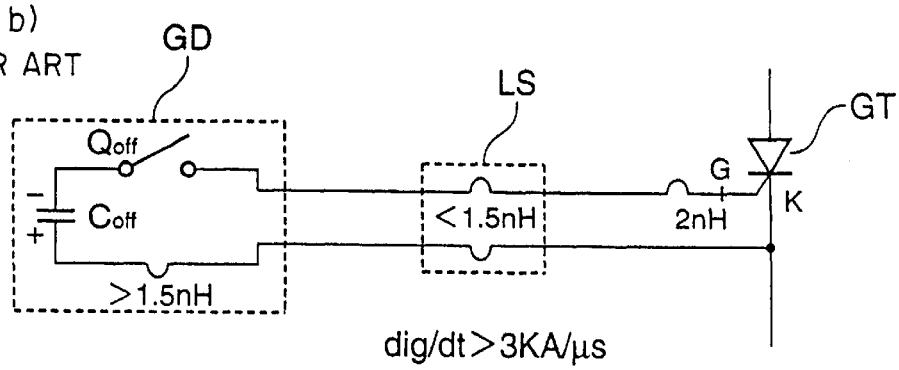
Figure 1C:
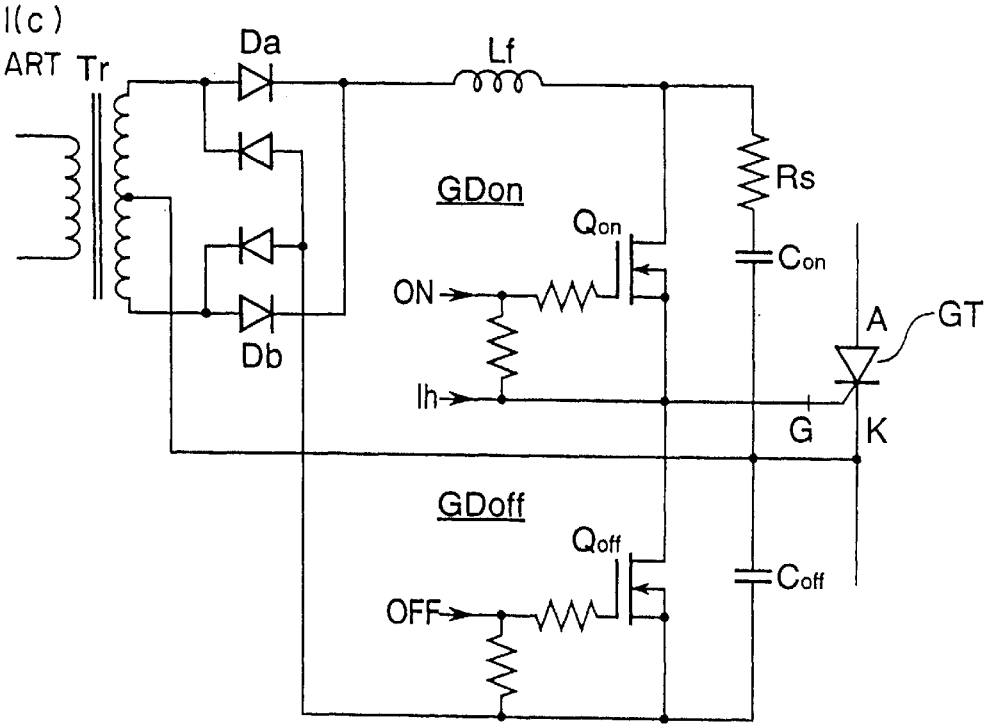
FIG. 1(c) shows the conventional gate driver circuit for the GCT thyristor GT in a simplified manner.

We will now explain in detail suitable embodiments of the present invention, with reference to the accompanied drawings. First, we refer to FIG. 3, which depicts the circuitry design of the GTO thyristor gate driver device according to an embodiment of the present invention. GTO thyristor 1 is equipped with anode electrode 1a, cathode electrode 1k, and gate electrode 1g. Anode electrode 1a and cathode electrode 1k are connected in series in the main power circuit. Cathode electrode 1k and gate electrode 1g are connected to gate drive circuit 4 via cathode gate conductors 2 and 3. This gate drive circuit 4 consists mainly of turn-on circuit 5, turn-off circuit 6, and power source circuit 7. Power source circuit 7, with ground potential 0 V of conductor 2 as reference potential, applies positive and negative output voltages to the positive and negative conductors 9, respectively.

Turn-on circuit 5 is equipped with a plural number (i pieces; in the depicted example, i=2) of power MOSFET elements Q11–Q1i, which are connected in series as switching elements. The source electrodes S11–S1i of these elements are connected to gate conductor 3, and drain electrodes D11–D1i are connected to positive conductor 8. A plural number (m pieces) of ceramic capacitors C11–C1m are connected in series between cathode conductor 2 and positive conductor 8 as turn-on capacitors for storing a turn-on electric charge. Also, a holding current supply circuit not illustrated in the drawing is connected to gate conductor 3. While thyristor 1 is on, this holding current supply circuit supplies holding current Ih to thyristor gate electrode 1g.

The gate electrodes, power MOSFET Q11–Q1i, receive gate control signals from RC time constant circuit TC via resistors R11–R1i. This time constant circuit TC consists of a MOSFET switch element Qt which has bias resistance RB and receives turn-on command signal Son, and a resistance capacitor circuit equipped with resistors Rt1–Rt3 and capacitor Ct connected in series to the aforementioned element Qt; and it is powered by smoothing capacitor Cf which is charged from positive conductor 8 via diode Df.

Similarly to turn-on circuit 5, turn-off circuit 6 is equipped with a plural number (j pieces; in the drawing example, j=11) of power MOSFET elements Q21–Q2ji connected in series as switching elements. The source electrodes S21–S2ji of these elements are connected to negative conductor 9, and drain electrodes D21–D2j are connected to conductor 3. Also, similarly, a plural number (n pieces) of ceramic capacitors C21–C2n are connected in series between cathode conductor 2 and negative conductor 9 as turn-off capacitors for storing a turn-off electric charge. The gate electrodes, elements Q11–Q1i, receive turn-off command signal Soff via gate resistors R21–R2j and bias resistance R5.

Power source circuit 7 is equipped with a power source insulation switching transformer Thf which receives high-frequency rectangular wave voltage at its primary winding, and a full wave rectification circuit with intermediary terminals consisting of diodes D1–D4 connected to the input terminals at both ends of the secondary winding of the aforementioned high-frequency switching transformer Thf. The positive and negative output terminals of this full wave rectification circuit are respectively connected to positive and negative conductors 8 and 9, and the intermediate terminals of the secondary winding of the switching transformer Thf are connected to the cathode conductor 2 of reference potential 0V. Also, the leakage inductance of the switching transformer Thf has been made to match the frequency of the high-frequency rectangular wave voltage, and, by using this leakage inductance and rapid switching action, it can supply a rectified output of a suitable peak current directly to capacitors C11–C1m and C21–C2n via positive and negative conductors 8 and 9 and the cathode conductor 2, without adding any inductance, resistance, or other limiting circuitry elements to the output of the transformer Thf.

Figure 4:
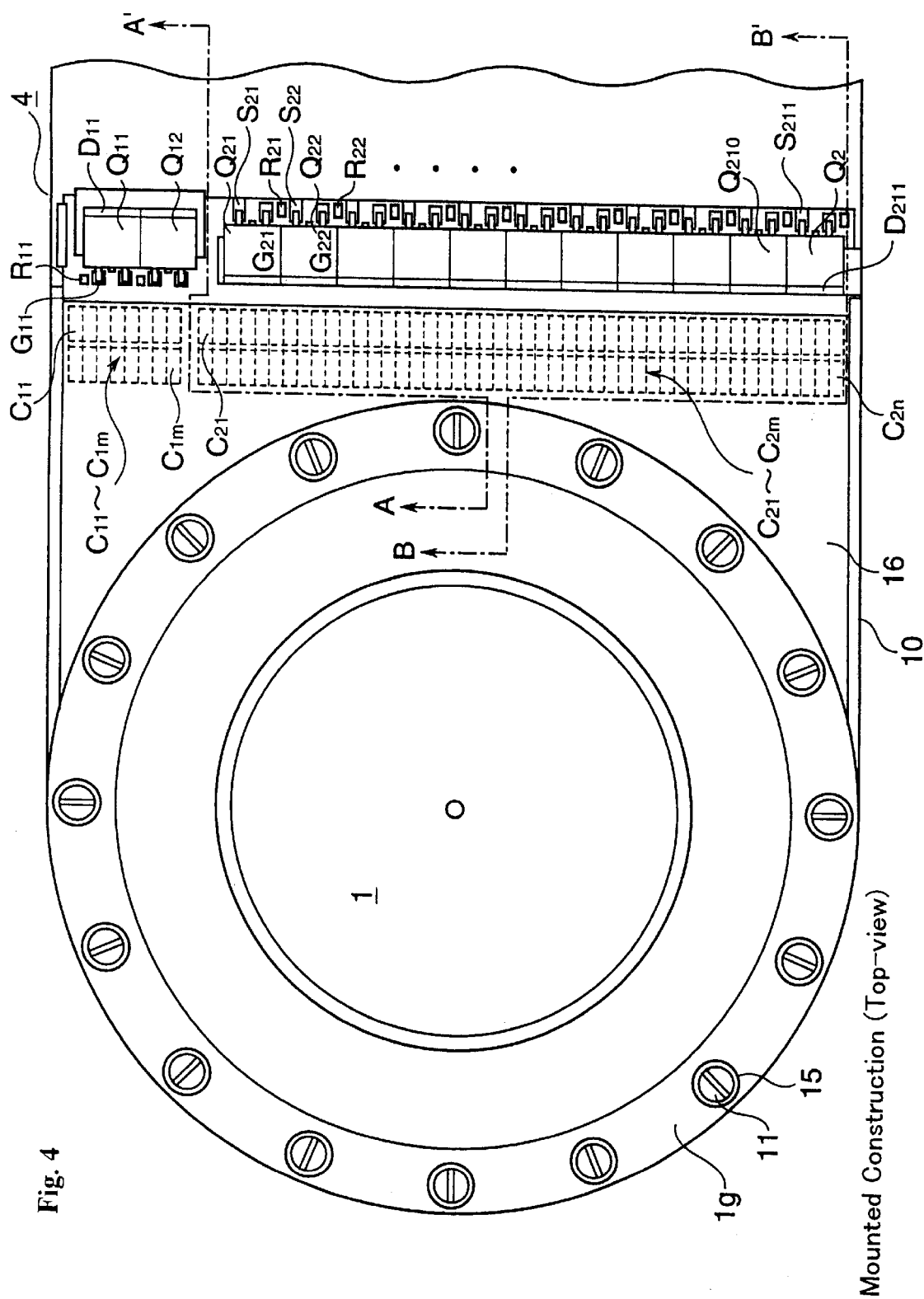
FIG. 4 is a top view of the mounted construction of a gate driver device according to an embodiment of the present invention.

Next, FIG. 4 shows the top-view of the mounted construction of a GTO thyristor gate driver device according to an embodiment of this invention, and FIG. 5(a) shows a rough side-view of the mounted construction as seen from the lower side of FIG. 4. The metal holding plate 10 for supporting the gate driver device on which gate drive circuit 4 is mounted has GTO thyristor 1 located on one side (the left side in the drawing) and is connected to cathode electrode 1k of thyristor 1 and made to have the same potential as the electrode. GTO thyristor 1 is fastened with screws 11 and screw attaching ring 12. The screws 11 pass through a plural number (16 in the drawing example) of holes provided in the outer ring of gate electrode 1g. This screw-fastened part, as shown in the enlarged cross-sectional view in the lower part of FIG. 5(a), is made up of spring washer 13, flat washer 14, insulation bushing 15, gate electrode 1g, laminated plate 16, metal (conductive) space ring (collar) 17, and holding plate 10, sandwiched in that order between screw 11 and ring 12.

Laminated plate 16 is a very thin sheet of between approximately 20 and 50 μm in thickness, with a predetermined width (in FIG. 4, the length in the top to bottom direction) and predetermined length (in FIG. 4, the length in the left to right direction). It is a flexible plate consisting of a series of first to fourth conductors 16a–16d adhered to both sides of an insulation layer 16i. These conductors 16a–16d are generally formed from thin copper and other metal sheets with a thickness ranging approximately from 20 to just over 100 μm. The first conductor 16a is attached to the upper side of laminated plate 16 for practically the entire width of the plate and forms a gate conductor 3.

The second conductor 16b, which forms part of the cathode conductor 2, the third conductor 16c, which forms positive conductor 8 and has the prescribed width, and the fourth conductor 16d, which forms negative conductor 9 and has the prescribed width, are attached on the lower side of laminated plate 16. The second conductor 16b is attached for the entire width of the plate in area 1 near the thyristor (screw-fastened part) on the lower left side of the laminated plate 16. Therefore, the first conductor 16a (gate conductor 3) is fastened with screws 11 to the gate electrode 1g of GTO thyristor 1 via insulation bushings 14 and connected to gate electrode 1g, and the second conductor 16b (cathode conductor 2) is connected to holding plate 10 and cathode electrode 1k of GTO thyristor 1 via collar 17.

The end part of this second conductor 16b (the right end illustrated in the drawing) is connected to a fifth conductor 18 which forms another part of cathode conductor 2. The fifth conductor 18 is located on top of holding plate 10 via an insulation layer 19 and is generally formed from thin copper and other flexible metal sheets with a thickness ranging approximately from 20 to just over 100 μm. The third and fourth conductors 16b and 16c are mutually isolated from the other conductors and located in areas 2 and 3 in the center of the lower side of laminated plate 16. Both electrodes of the turn-on and turn-off chip-type ceramic capacitors C11–C1m and C21–C2n are connected between these conductors 16b and 16c and the fifth conductor 18, respectively.

FIG. 5(b) is shown as an example to explain the layout/connected state of these capacitors. The attached state of some of the turn-on capacitors is shown in perspective with laminated plate 16 excluded from view. FIG. 6(a) and FIG. 6(b) show enlarged cross-section views of the turn-on and turn-off parts of the gate drive device as seen from the bottom of cross sections A–A' and B–B' of FIG. 4, respectively.

Turn-on/off capacitor sets respectively consisting of a plural number of chip-type ceramic capacitors C11–C1m and C21–C2n are located on top of the fifth conductor 18 which is attached on top of holding plate 10 and separated by a sheet insulation layer 19 (the drawings show respective examples). As shown in the drawings, the ceramic capacitors are arranged so that their non-electrode sides in the direction of the thickness of the chips are adjacent to each other and both facing electrode sides are on the top and bottom. Turn-on capacitor set C11–C1m is sandwiched between the third conductor 16c and the fifth conductor 18, and the top and bottom electrode sides are respectively connected to the corresponding conductors 16c and 18 with a conductive adhesive (solder). Turn-off capacitor set C21–C2n is sandwiched between the fourth conductor 16d and the fifth conductor 18, and, similarly, both electrode sides are connected to conductors 16d and 18. Note that each ceramic capacitor is equipped internally with a plural number of charging pole plates installed from both electrodes parallel to the non-electrode sides so that they alternately face each other.

Printed circuit board 20 is separated by insulation layer 19 and attached to the other side of holding plate 10. This printed circuit board 20 is mounted with MOSFET elements Q11–Q1i and Q21–Q2j, as well as power source circuit 7, turn-on/off control circuits, logic circuits, and various other control circuits (none of which are illustrated as they are located further to the right of the drawings). Laminated plate 16 is connected to the top of the thyristor end of this printed circuit board 20 and the fifth conductor 18 extends underneath. The first to fifth conductors 16a–16d are connected to their control circuits via conductor paths formed on the printed circuit board 20.

With regard to MOSFET elements Q11–Q1i and Q21–Q2j, the source electrodes S11–S1 of turn-on elements Q11–Q1i, and the drain electrodes D11–D1j of turn-off elements Q21–Q2j, are all connected to the first conductor 16a which forms gate conductor 13. On the other hand, the drain electrodes D11–D1i of turn-on elements Q11–Q1i are connected to the third conductor 16c which forms positive conductor 8, and the source electrodes S11–S1j of turn-off elements Q21–Q2j are connected to the fourth conductor 16d which forms negative conductor 9.

Generally, the stray inductance Ls which occurs in two flat plate-like conductors is expressed by the following equation (1):

$$Ls[\mu H] = 1.26 \times d \times 1/w \tag{1}$$

Where,
d: the thickness [m] of the intermediate insulation layer
l: the length [m] of the conductor
w: the width [m] of the conductor Viewed from this point, with this invention, as in the above embodiment, if the intermediate insulation layer 16i of the laminated plate 16 is formed very thin, for example, 50 μm, and the width of the conductor is formed at dimensions in the range of 20 mm or more on the turn-on side and 110 mm or more on the turn-off side, the effective length can also be formed at about 20 mm or more, so the wiring inductance between the capacitor and MOSFET connected in series between gate 1g and cathode 1k of GTO thyristor 1 can be greatly reduced to about nH or less, that is, to a value too low to measure by ordinary means. Thus, a large gate current rise rate can be obtained at turn-on and turn-off times.

Also, when the gate drive device is operated and a large turn-off current of, say, 3000 A(amperes), flows between the fourth and fifth conductors 16d and 18 causing the temperature to rise, even though there may be a thermal expansion difference between these conductors and the ceramic capacitors, the difference will be absorbed between the adjoining non-electrode sides of the ceramic capacitors. Thus, damage to the ceramic capacitors can be prevented and the reliability can be improved. Furthermore, these ceramic capacitors are neatly arranged and compactly housed between the third and fourth conductors 16c and 16d and the fifth conductor 18, which contributes greatly to the miniaturization of the overall gate drive device.

Figure 3:
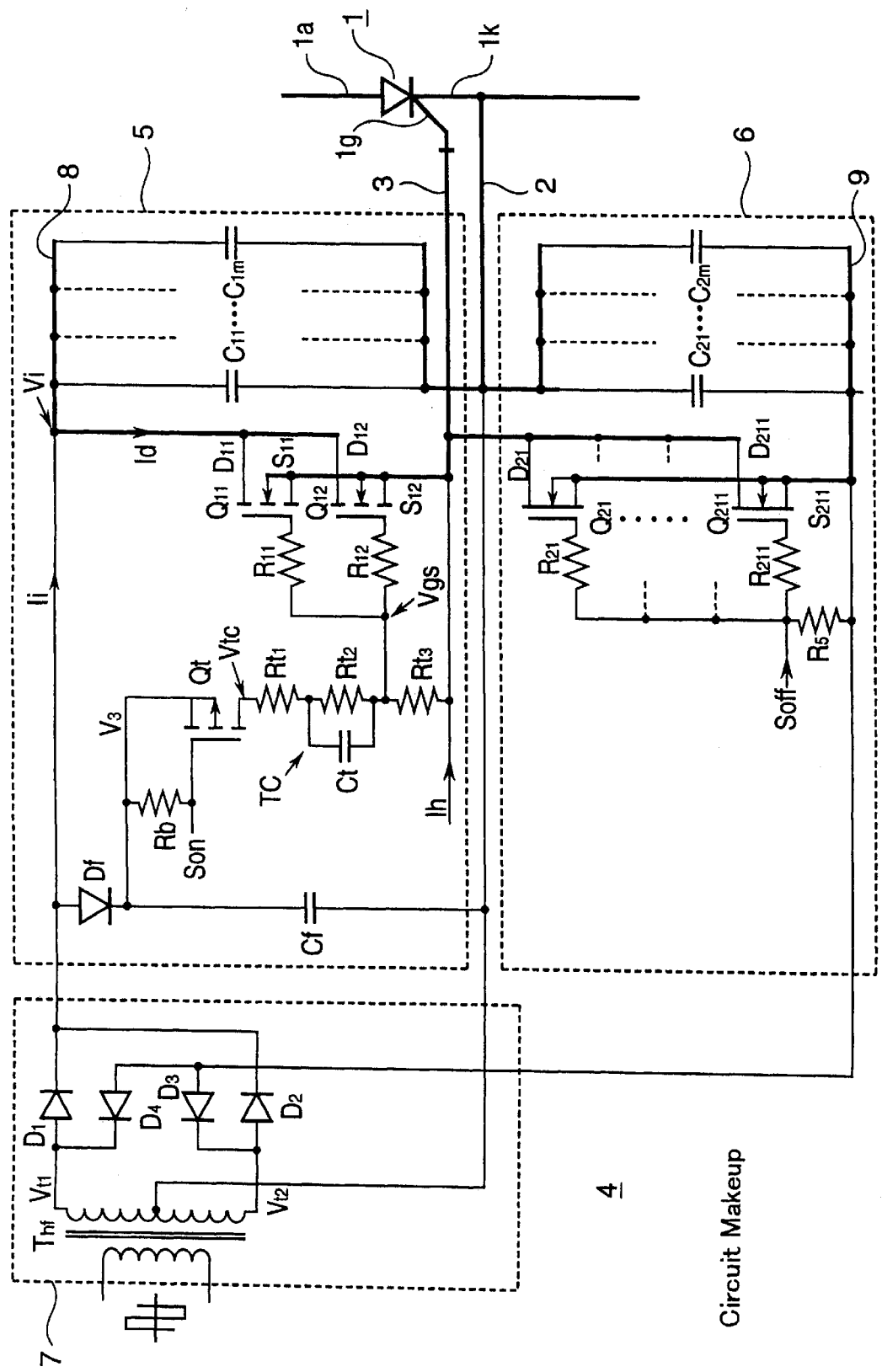
FIG. 3 shows the circuitry make-up of a gate driver device according to an embodiment of the present invention.

Now, as mentioned above, when a peak current flows at turn-on time, a large gate current rise rate and peak current can be obtained because there is no resistance in turn-on circuit 5. However, an oscillating circuit is formed between the stray inductance of power source circuit 7 and the capacity of the turn-on capacitors C11–C1m, thus causing a possible instability in the operation. Accordingly, with this invention, an RC time constant circuit TC consisting of resistances Rt1–Rt3 and capacitor C is employed, as shown in FIG. 3, to exponentially reduce the voltage Vgs between the gate and source of MOSFET elements Q11–Q1i, and to control the drain current Id of MOSFET elements Q11–Q1i so that it changes temporally.

FIG. 7(a) shows an example of a characteristic of the drain current ID of MOSFET elements Q11–Q1i to the voltage between gate and source Vgs (voltage between drain and source Vds=5V). FIG. 7(b) shows a design example of the temporal changes in the voltage between gate and source Vgs due to time constant circuit TC. Specifically, the following design equations can be obtained with respect to the circuit of FIG. 3:

$$Vgs = Vgs1 + (Vgs0 - Vgs1)\exp(-t/\tau) \tag{2}$$

where, $$Vgs0 = (Vtc - Vgk0) \times Rt3 / (Rt1 + Rt3) \tag{3}$$

$$Vgs1 = (Vtc - Vgk1) \times Rt3 / (Rt1 + Rt2 + Rt3) \tag{4}$$

$$\tau = CtRt2 \times (Rt1 + Rt3) / (Rt1 + Rt2 + Rt3) \tag{5}$$

Vgk 0: Voltage between the gate and cathode of GTO thyristor 1 immediately after turn-on.
Vgk 1: Voltage between gate and cathode when gate current Ig of GTO thyristor 1 drops to the holding current Ih.
Vtc: Voltage applied to time constant circuit TC.

For example, if Vtc=18.2V, Vgk 0=Vgk 1=0.8V, Ct=0.2 μF, Rt1=27Ω, Rt2=220Ω, and Rt3=51Ω, then Vgs 0=10V, Vgs 1=3V, τ=11.5 μs, and the gate voltage changes of MOSFET elements Q11–Q1i as shown in FIG. 7(b) will be obtained, and temporal changes in drain current Id can be obtained using the Id to Vgs characteristic of FIG. 7(a).

In such a case, if the turn-on signal Son applied to the gate of MOSFET switch element Qt is turned off before drain current Id becomes zero, the drain current Id drops suddenly and there is the possibility that the circuit's stray inductance may cause a voltage spike. Therefore, turn-on signal Son must be turned off after drain current Id becomes zero.

Also, with this invention, as shown in FIG. 3, the output of high-frequency switching transformer Thf is first rectified by diodes D1 and D2 and then fed directly to turn-on capacitors C11–C1m. That is, by utilizing the rapid switching action brought about by the leakage inductance and the high-frequency rectangular wave of transformer Thf, the smoothing inductance and current-limiting resistance inserted between the above-mentioned capacitors in the past can be abolished, and capacitors C11–C1m can be rapidly charged. FIG. 8 shows that principle.

Figure 8A:
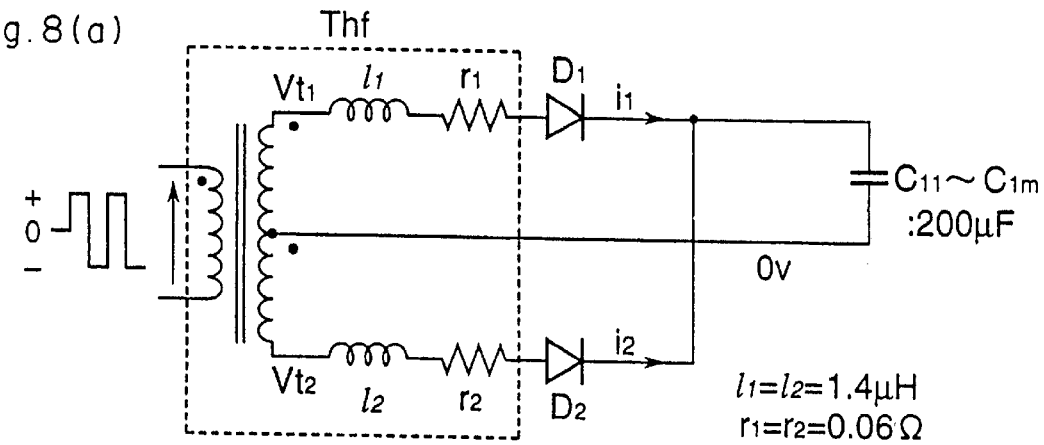
FIG. 8(a) shows the equivalent circuit of a turn-on circuit according to an embodiment of the present invention.
Figure 8B:
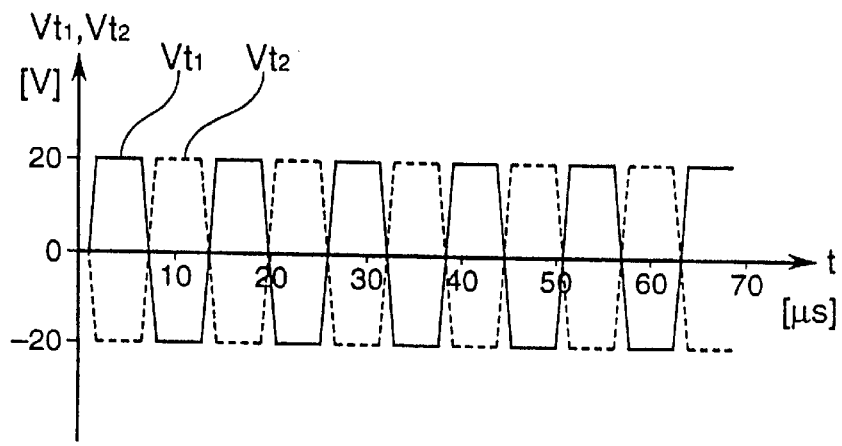
FIG. 8(b) shows the secondary side internal electromotive force waveform of a switching transformer.
Figure 8C:
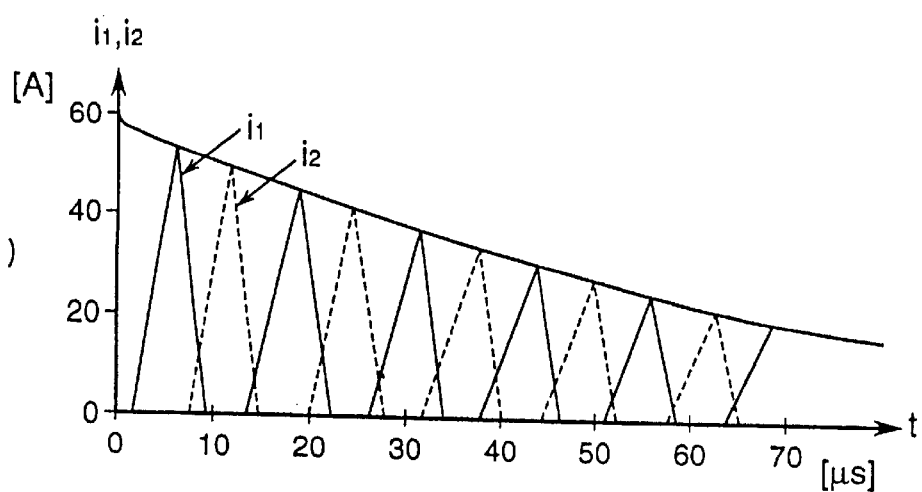
FIG. 8(c) shows the rectified output current of each diode.

FIG. 8(a) shows an equivalent circuit between power source circuit 7 and turn-on circuit 5 of FIG. 3. If transformer Thf's leakage inductance l1=l2=1.4 μH and internal resistance r1=r2=0.06, then the overall capacity of capacitors C11–C1m is 200 μF. FIG. 8(b) shows the waveforms of the secondary side electromotive force Vt1 and Vt2 of the transformer Thf. For example, if the repeated frequency fr of this electromotive force is 80 kHz, the peak value is ±20V. FIG. 8(c) shows the rectified output current i1 and i2 from diodes D1 and D2 when charging the capacitors C11–C1m under the conditions of the values of the examples shown.

That is, the output current i1 and i2 of each diode, as shown in FIG. 8(c), become triangular waveforms which exponentially lower the peak(transition is by reverse recovery current of diodes D1 and D2), and the output current can be held to less than a fixed value by the transformer Thf's internal electromotive force Vt1 and Vt2, leakage inductance l1 and l2, and chopping frequency fr, without inserting any inductance and resistance elements into the outside of transformer Thf. Therefore, capacitors C11–C1m can be charged gradually and exponentially without any overshooting.

Next, FIG. 9 shows the actually measured waveforms of the various circuit parts from the time the "on" action of GTO thyristor 1 starts until the lapse of 34 μs, when, as in the above-mentioned example, capacitors C11–C1m of 200 μF are used. That is, FIG. 9(a) shows the voltage Vgs between the gate and source of MOSFET elements Q11–Q1i and the voltage Vgk between gate and cathode (gate voltage), FIG. 9(b) shows the drain current Id of MOSFET elements Q11–Q1i, and FIG. 9(c) shows the input voltage Vi to the turn-on circuit 5. Note that in FIG. 9(a), the peak value of voltage Vgs, a value obtained by subtracting the voltage of waveform "Vgk" from the voltage of waveform "Vgs+Vgk", is about 8.5V because it started up from gate voltage Vgk=−20V in the off state of GTO thyristor 1. Also, a crest has occurred at the peak point of gate voltage Vgk due to stray inductance.

FIG. 10 shows, under the same conditions, the actually measured waveforms of the various circuit parts, when GTO thyristor 1 is repeatedly turned on for 200 μs and off for 1300 μs, from the time the "on" action of GTO thyristor 1 starts until the lapse of 2 ms. That is, FIG. 10(a) shows voltages Vgs and Vgk, FIG. 10(b) shows the drain current Id of MOSFET elements Q11–Q1i and the gate voltage Vgk of GTO thyristor 1, FIG. 10(c) shows the voltage input into turn-on circuit 5 of the turn-on circuit input voltage Vi, and FIG. 10(d) shows input current Ii to turn-on circuit 5, thus confirming that the desired control operation had been realized.

As explained above, this invention makes it possible to obtain an even larger rate of gate current increase when an improved-type GTO thyristor such as the GCT thyristor is turned on and off. This results in an increase in the cut-off capability when turning off the GTO thyristor, even when snubberless, and a decrease in power loss when turning off the GTO thyristor. It also improves the di/dt withstand volume, and in addition, makes rapid control possible and provides for the use of many GTO thyristors in series or in parallel. Also, by using chip-type ceramic capacitors as the turn-on/off capacitors, thus doing away with the use of smoothing inductance, current-limiting resistance, and other circuitry elements which were inserted in series in the capacitors of the turn-on circuit, it offers superior effects such as a miniaturized gate driver device, improved reliability, reduced power consumption, and heightened switching frequency.

We claim:

1. A gate driver device for a GTO thyristor for turning on and off said GTO thyristor using an electric charge stored in a capacitor, said gate driver device comprising:

a first and second plate-shaped conductors which are connected to a cathode and a gate of said GTO thyristor respectively;

a plurality of chip-type capacitors, the electrodes on one side of which are connected to said first plate-shaped conductor;

a third plate-shaped conductor connected to the electrodes on the other side of said chip-type capacitors; and a plurality of switching elements, a first and second principal electrodes of which are connected between said second and said third conductors;

wherein said second and third plate-shaped conductors are formed to face each other and separated by a thin insulation layer; and said plurality of chip-type capacitors equipped with electrodes arranged to face each other on both end portions of said capacitors are mounted in the space between said first plate-shaped conductor and said third plate-shaped conductor.

2. A gate driver device for a GTO thyristor according to claim 1, wherein said plurality of chip-type capacitors are ceramic capacitors and arranged so that non-electrode sides in the direction of the thickness of said chips are adjacent to each other, and both electrode sides of said chips are connected to a surface of said first plate-shaped conductor and a surface of said third plate-shaped conductor respectively.

3. A gate driver device for a GTO thyristor for turning on and off said GTO thyristor using an electric charge stored in a capacitor, said gate driver device comprising:

turn-on capacitors, the electrodes formed on one side of which are connected to a first conductor, which is connected to a cathode of said GTO thyristor;

switching elements with gate electrodes, both principal electrodes of which are connected between a second conductor connected to a gate of said GTO thyristor and a third conductor connected to the electrodes on the other side of said turn-on capacitors;

a holding current supplying means for supplying a constant gate holding current to said gate of said GTO thyristor through said second conductor during the period where the GTO thyristor is turned on; and a gate signal control circuit for said switching elements equipped with time constant elements;

wherein said gate signal control circuit for switching elements supplies said gate electrodes of said switching elements with a gate voltage which decreases exponentially until the gate current of said GTO thyristor reaches the gate holding current.

4. A gate driver device for a GTO thyristor for turning on and off said GTO thyristor using an electric charge stored in a capacitor, said gate driver device comprising:

turn-on capacitors, the electrodes formed on one side of which are connected to a first conductor, which is connected to a cathode of said GTO thyristor;

switching elements with gate electrodes, both principal electrodes of which are connected between a second conductor connected to a gate of said GTO thyristor and a third conductor connected to the electrodes on the other side of said turn-on capacitors; and a rectifying circuit for charging capacitors of an insulated power source equipped with a switching transformer for power source insulation;

wherein said switching transformer is driven by a high-frequency rectangular wave voltage, and a resultant rectified output is supplied directly to said turn-on capacitors through said first conductor and said third conductor.

* * * * *